(12) United States Patent
Choi (10) Patent No.: US 10,573,694 B2
(45) Date of Patent: Feb. 25, 2020

(54) BACKPLANE SUBSTRATE AND FLEXIBLE DISPLAY USING THE SAME

(71) Applicant: LG Display Co., Ltd., Seoul (KR)

(72) Inventor: Won-Jin Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 15/721,240

(22) Filed: Sep. 29, 2017

(65) Prior Publication Data

US 2018/0097044 A1   Apr. 5, 2018

(30) Foreign Application Priority Data

Sep. 30, 2016  (KR) .......................... 10-2016-0127059

(51) Int. Cl.
| | |
|---|---|
| *H01L 27/32* | (2006.01) |
| *H01L 51/00* | (2006.01) |
| *H01L 51/52* | (2006.01) |
| *G06F 3/041* | (2006.01) |
| *G09G 3/3225* | (2016.01) |

(52) U.S. Cl.
CPC .......... *H01L 27/3223* (2013.01); *G06F 3/041* (2013.01); *G09G 3/3225* (2013.01); *H01L 27/3258* (2013.01); *H01L 27/3276* (2013.01); *H01L 51/0097* (2013.01); *H01L 51/5253* (2013.01); *G06F 2203/04102* (2013.01); *G09G 2300/0413* (2013.01); *G09G 2380/02* (2013.01); *H01L 27/323* (2013.01); *H01L 2251/5338* (2013.01)

(58) Field of Classification Search
CPC ............ H01L 27/3223; H01L 27/3258; H01L 27/3276; H01L 51/0097; H01L 51/5253; H01L 27/323; H01L 2251/5338; G06F 3/041; G06F 2203/04102; G09G 3/3225; G09G 2300/0413; G09G 2380/02
See application file for complete search history.

(56) References Cited

U.S. PATENT DOCUMENTS

| | | | |
|---|---|---|---|
| 2012/0099067 A1* | 4/2012 | Hara ................. | G02F 1/136277 349/139 |
| 2016/0233248 A1* | 8/2016 | Kwak ..................... | H01L 51/56 |
| 2017/0263887 A1* | 9/2017 | Han .................... | H01L 27/3276 |

* cited by examiner

Primary Examiner — Yaron Cohen
(74) Attorney, Agent, or Firm — Seed IP Law Group LLP (57) ABSTRACT

Disclosed are a backplane substrate, which has a modified dummy pixel configuration, thereby preventing water permeation and cracks from the side surface due to repeated folding, and a flexible display using the same. A plurality of slits is provided in a dummy pixel portion and separates an interlayer insulation stack for respective dummy pixels.

21 Claims, 10 Drawing Sheets

GENERATION OF
WATER PERMEATION

BACKPLANE SUBSTRATE AND FLEXIBLE DISPLAY USING THE SAME

CROSS-REFERENCE TO RELATED APPLICATION

This application claims the benefit of Korean Patent Application No. 10-2016-0127059, filed on Sep. 30, 2016, which is hereby incorporated by reference as if fully set forth herein.

BACKGROUND

Technical Field

The present disclosure relates to a backplane substrate, and more particularly, to a backplane substrate, which adopts an improved dummy pixel configuration, thereby preventing the propagation of water permeation and cracks from the side surface due to repeated folding, and a flexible display using the same.

Description of the Related Art

Concrete examples of a flat panel display device may include, for example, a liquid crystal display (LCD) device, an organic light-emitting display (OLED) device, a plasma display panel (PDP) device, a quantum dot display device, a field emission display (FED) device, and an electrophoretic display (EPD) device. These devices are alike in that they necessarily require a flat display panel that realizes an image. Such a flat display panel has a configuration in which a pair of transparent insulation substrates is bonded to face each other with an inherent luminous or polarizing material or some other optical material layer therebetween.

With the recent increase in the size of display devices, a demand for a planar display device that occupies a small volume of space is increasing. As this demand grows, recently, there is a demand for using the planar display device in a flexible form.

A flexible display is gradually thinning and developing to a foldable form. However, flexible displays to date have shown various problems, such as damage to a folding portion as a folding operation is repeated and the number of folding operations is increased. For example, high physical stress upon folding causes damage to pixels in a folding area, preventing the folding portion from being turned on at all. Even if turn-on failure due to repeated folding does not occur, the repeated folding causes variation in a capacitance value of each sub-pixel as time passes, which results in deterioration in image quality.

Figure 1A:
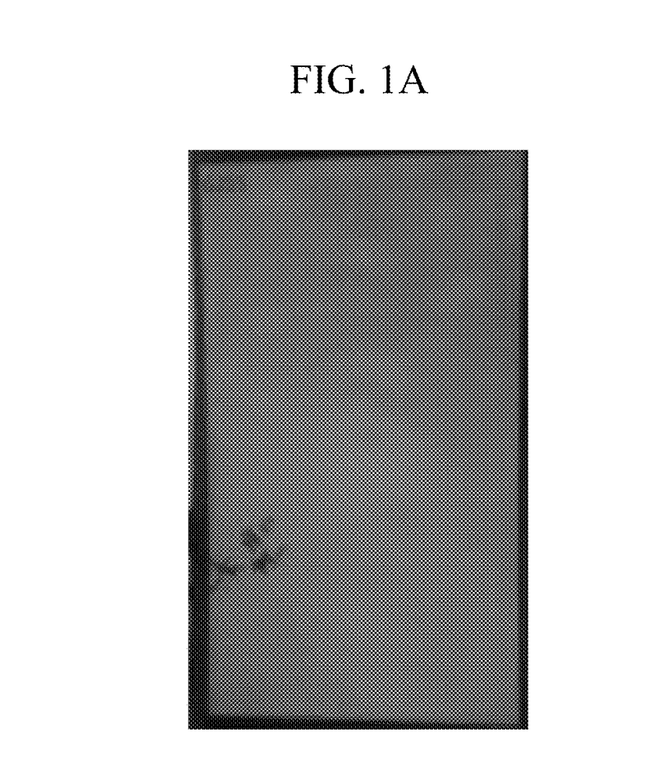
FIGS. 1A and 1B are a photograph of a flexible display and an enlarged photograph illustrating the side portion in which a water permeation default occurs.
Figure 1B:
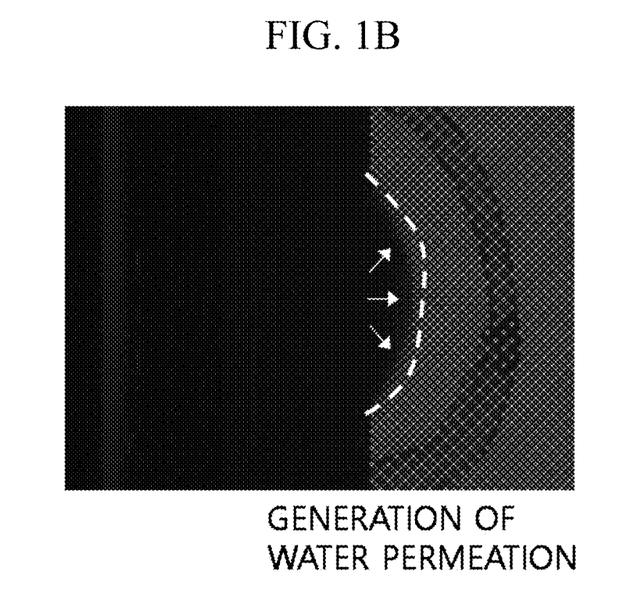

FIGS. 1A and 1B are a photograph of a flexible display and an enlarged photograph illustrating the side portion in which water permeation occurs.

As illustrated in FIGS. 1A and 1B, in a flexible display that has undergone repeated folding, in particular, severe stress applied to the outer peripheral portion along the folding axis may cause, for example, water permeation in the corresponding portion, which may cause turn-on failure of pixels. In addition, such a damage generated in the outer peripheral portion may propagate from the edge to the center of the flexible display along the folding axis as folding is repeated.

BRIEF SUMMARY

Accordingly, the present disclosure is directed to a backplane substrate and a flexible display using the same that substantially obviate one or more problems due to limitations and disadvantages of the related art.

An object of the present disclosure is to provide a backplane substrate, which adopts an improved dummy pixel configuration, thereby preventing the propagation of water permeation and cracks from the side surface due to repeated folding, and a flexible display using the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The present disclosure prevents the propagation of cracks from the edge portion in the direction in which stress is applied by forming slits in the edge portion so as to separate dummy pixels from each other.

To achieve these objects and other advantages and in accordance with the purpose of the disclosure, as embodied and broadly described herein, a backplane substrate includes a flexible base in which an active area having a plurality of sub-pixels is defined in a center thereof and a dummy pixel portion having dummy pixels is defined along an edge of the active area, a buffer stack provided on the flexible base including the active area and the dummy pixel portion, a plurality of first wires provided in a line direction in both the active area and the dummy pixel portion so as to be in contact with the buffer stack, an interlayer insulation stack configured to cover the first wires, the interlayer insulation stack including a plurality of interlayer insulation layers located above the active area and the dummy pixel portion, a second wire provided in the active area and a second dummy wire provided in the dummy pixel portion, the second wire and the second dummy wire being provided on the interlayer insulation stack in a direction crossing the first wires, and a plurality of slits located in the dummy pixel portion so as to separate the interlayer insulation stack for the respective dummy pixels.

Here, the slits may include one or more slits provided in each dummy pixel.

In addition, the slits may be defined by removing the interlayer insulation layers.

In addition, the buffer stack may include one or more inorganic buffer layers, an active buffer layer and a gate insulation layer on the flexible base. In this case, the slits may be defined by removing the interlayer insulation layers and the gate insulation layer under the interlayer insulation layers. Alternatively, the slits may be defined by removing the interlayer insulation layers, and the gate insulation layer and the active buffer layer under the interlayer insulation layers.

In addition, the backplane substrate may further include an active layer between the active buffer layer and the gate insulation layer in the sub-pixels.

The slits may expose the buffer stack or the first wires.

In addition, the slits may include at least one slit provided in each dummy pixel.

Meanwhile, the backplane substrate may further include a scan driver outside the dummy pixel portion. In addition, the first wires may be connected to the scan driver.

In addition, the interlayer insulation stack may include a plurality of inorganic layers.

In accordance with another aspect of the present disclosure, a flexible display includes the backplane substrate described above, a planarization layer configured to cover the second wire and the second dummy wire on the backplane substrate, organic light-emitting diodes provided on the planarization layer so as to correspond to the respective sub-pixels, each organic light-emitting diode including a first electrode, an organic light-emitting layer and a second electrode, an encapsulation layer configured to cover the organic light-emitting diodes, an opposing base that is opposite the base, a touch electrode array provided on the opposing base, and an adhesive layer between the touch electrode array and the encapsulation layer.

The encapsulation layer may have an area greater than that of the planarization layer, and may cover the second dummy wire and the slits.

In addition, the touch electrode array may include a plurality of first and second touch electrodes provided on the opposing base so as to correspond to the active area, the first and second touch electrodes crossing each other.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

The advantages and features of the present disclosure and the way of attaining them will become apparent with reference to embodiments described below in detail in conjunction with the accompanying drawings. The present disclosure, however, are not limited to the embodiments disclosed hereinafter and may be embodied in many different forms. Rather, these exemplary embodiments are provided so that this disclosure will be through and complete and will fully convey the scope to those skilled in the art. The scope of the present disclosure should be defined by the claims.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "overlying", "below", "aside", or the like, one or more other parts may be located between the two parts unless the term "directly" is used.

In the description of the various embodiments of the present disclosure, when describing temporal relationships, for example, when the temporal relationship between two actions is described using "after", "subsequently", "next", "before", or the like, the actions do not need to occur in succession unless the term "directly" or similar term is used.

In the description of the various embodiments of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various embodiments of the present disclosure may be partially or wholly coupled to and combined with each other, and various technical linkage and driving thereof are possible. These various embodiments may be performed independently of each other, or may be performed in association with each other.

A backplane substrate, which will be described below, is a configuration in which a thin-film transistor array and an organic light-emitting array are provided on a flexible base. In some cases, the backplane substrate also refers to a configuration in which only a thin-film transistor array, excluding an organic light-emitting array, is included. A backplane substrate includes a plurality of sub-pixels, and enables gradation for respective sub-pixels.

In addition, the backplane substrate of the present disclosure has a structure that exhibits excellent folding reliability when applied to a flexible display, but is not limited in the application to the flexible display, and may be applied to any other flat panel display device. In this case, the base used therein may be any one of a glass substrate and a plastic substrate. That is, in the following description, although the base will be described as a flexible base, the disclosure is not limited thereto, and the base may be formed of a hard material. In this case, the backplane substrate of the present disclosure may be applied to a flat panel display device, and even in this case, the reliability of the device may be increased via a slit.

Figure 2:
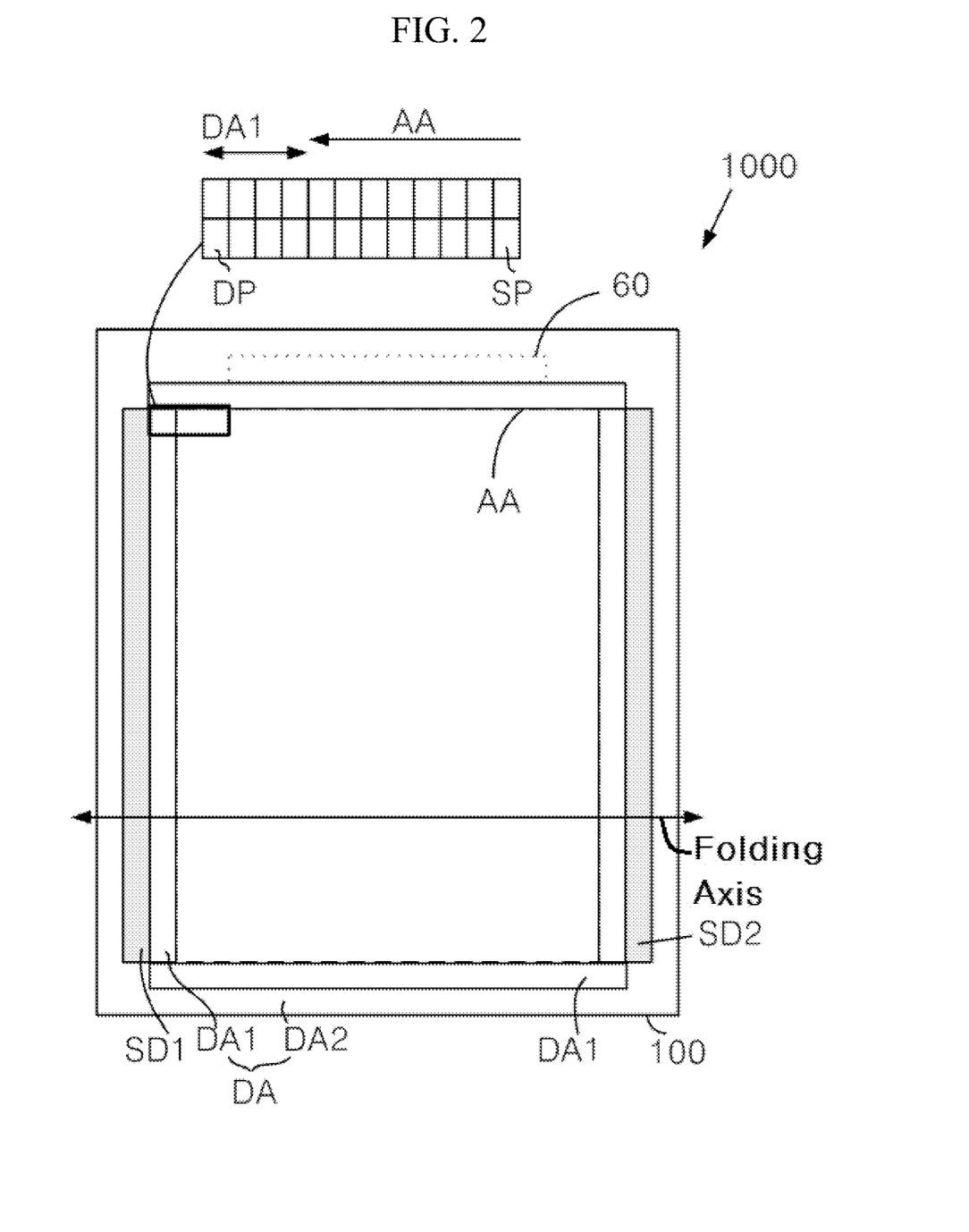
FIG. 2 is a plan view illustrating a backplane substrate according to the present disclosure.
Figure 3:
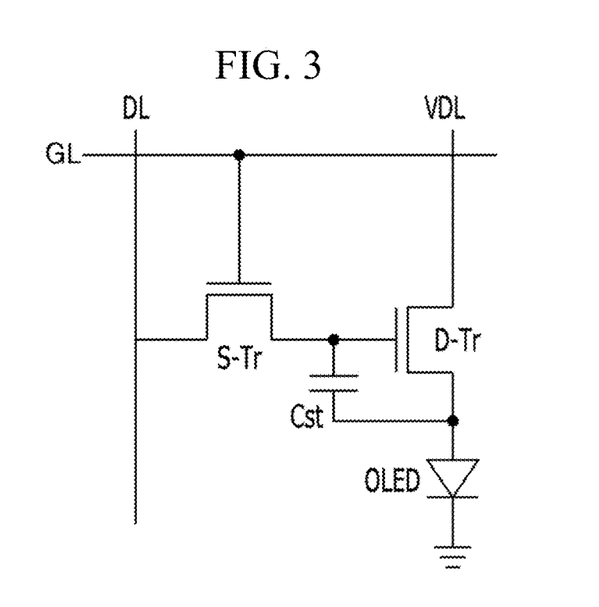
FIG. 3 is a circuit diagram of a sub-pixel illustrated in FIG. 2.

FIG. 2 is a plan view illustrating a backplane substrate according to the present disclosure, and FIG. 3 is a circuit diagram of a sub-pixel illustrated in FIG. 2.

As illustrated in FIG. 2, in the backplane substrate 1000 of the present disclosure, an active area AA having a plurality of sub-pixels SP is defined in the center thereof, and a dummy pixel portion DA1 having one or more dummy pixels DP provided in the same line as the pixels SP is defined along the edge of the active area AA. The dummy pixels DP may be provided in a number of ten or fewer at opposite sides or the upper and lower sides of the active area AA, in order to avoid deterioration in resolution.

The portion of the backplane substrate 1000 outside the active area AA is a non-display area DA. The non-display area DA includes the above-described dummy pixel portion DA1 and a dead area DA2. The dead area DA2 includes scan drivers SD1 and SD2 located at the outer side of the dummy pixel portion DA1, and a pad portion 60 provided on one side of the outer periphery of the active area AA, the pad portion 60 having a plurality of pad electrodes. In addition, a circuit board (not illustrated) may be connected to the pad electrodes of the pad portion 60 in the dead area DA2.

The scan drivers SD1 and SD2 may be provided in a built-in form to have a plurality of thin-film transistors for each line, in the same process as that for forming thin-film transistors in the active area AA. However, the backplane substrate of the present disclosure is not limited thereto, and in addition to the built-in-type scan drivers SD1 and SD2, a separate scan driver may be provided in a chip-on-film form.

In the backplane substrate 1000, a folding axis thereof is defined in a given direction. The folding axis corresponds to a hinge portion of the flexible display. The backplane substrate of the present disclosure is devised to prevent water permeation or cracks in an outer peripheral portion, which corresponds to the hinge portion, and includes a plurality of slits in insulation layers of the dummy pixel portion DA1. The propagation of stress that causes cracks may be prevented by the slits.

FIG. 3 is a circuit diagram of the sub-pixel in the active area AA according to an example. Each sub-pixel of the active area AA includes a circuit unit including at least one or more thin-film transistors S-Tr and D-Tr, a storage capacitor Cst, and an organic light-emitting diode OLED connected to the storage capacitor Cst and the thin-film transistor D-Tr.

FIG. 3 illustrates an example in which two thin-film transistors including a selection thin-film transistor S-Tr and a driving thin-film transistor D-Tr are provided, and any other thin-film transistor may be added as needed. Among these, the driving thin-film transistor D-Tr is electrically connected to a first electrode of the organic light-emitting diode OLED, and the storage capacitor Cst is connected between a gate electrode of the driving thin-film transistor D-Tr and a connection end at which the driving thin-film transistor D-Tr is connected to the first electrode of the organic light-emitting diode OLED. The connection end may be a source electrode or a drain electrode of the driving thin-film transistor D-Tr. When the connection end is the drain electrode, the source electrode is connected to a driving current line VDL and receives a driving voltage. When the connection end is the source electrode, the drain electrode is connected to the driving current line VDL.

In addition, the circuit unit is provided between a gate line GL and a data line DL, which are located at the boundary of the sub-pixel and cross each other. The driving current line VDL is parallel to the data line DL and is spaced apart from the data line DL of a neighboring sub-pixel. The selection thin-film transistor S-Tr is provided between the gate line GL and the data line DL and is connected to the gate electrode of the driving thin-film transistor D-Tr, which is connected to the storage capacitor Cst, so that a predetermined sub-pixel transfers current to the organic light-emitting diode OLED via the driving thin-film transistor D-Tr according to the selective driving of the selection thin-film transistor S-Tr, thereby performing on/off control of the organic light-emitting diode OLED.

In addition, a thin-film transistor of a gate circuit block is formed in a shape the same as or similar to that of the selection thin-film transistor or the driving thin-film transistor. Here, the selection thin-film transistor corresponds to the pixel thin-film transistor described above.

Figure 4A:
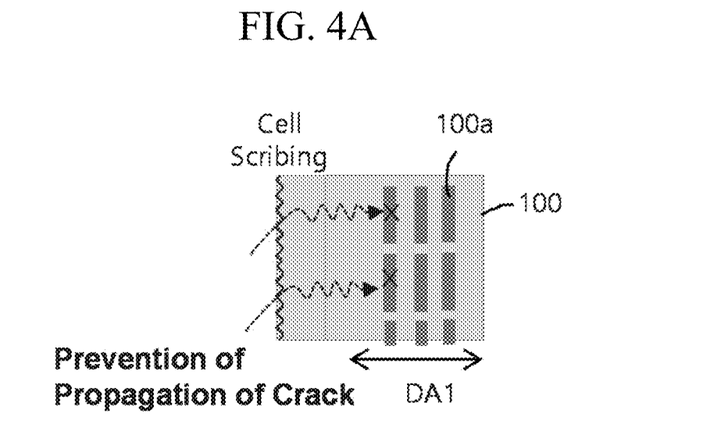
FIGS. 4A and 4B are plan views illustrating the outer peripheral portion of the backplane substrate according to the present disclosure.
Figure 4B:
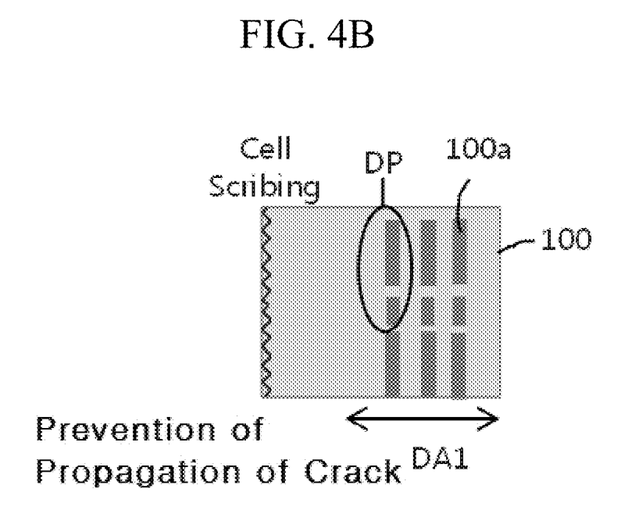

FIGS. 4A and 4B are plan views illustrating the outer peripheral portion of the backplane substrate according to the present disclosure.

As illustrated in FIG. 4A, the backplane substrate of the present disclosure includes a plurality of slits 100a in the outer peripheral portion of the base 100, more particularly, in the dummy pixel portion DA1. The plurality of slits 100a may be defined by removing a portion of the insulation layers provided on the base 100, and may be provided in a direction crossing the direction in which cracks propagate.

In addition, as illustrated in FIG. 4B, the slits 100a may have different shapes for respective sub-pixels.

Referring to the plane of FIG. 2, the slits may be formed only in a specific area defined by the folding axis, or may be provided for the respective dummy pixels.

Hereinafter, the formation of the slits will be described with reference to a method of manufacturing the backplane substrate according to the present disclosure. In addition, the configuration of the slits will be described in detail via comparison of the sub-pixel and the dummy pixel.

Figure 5:
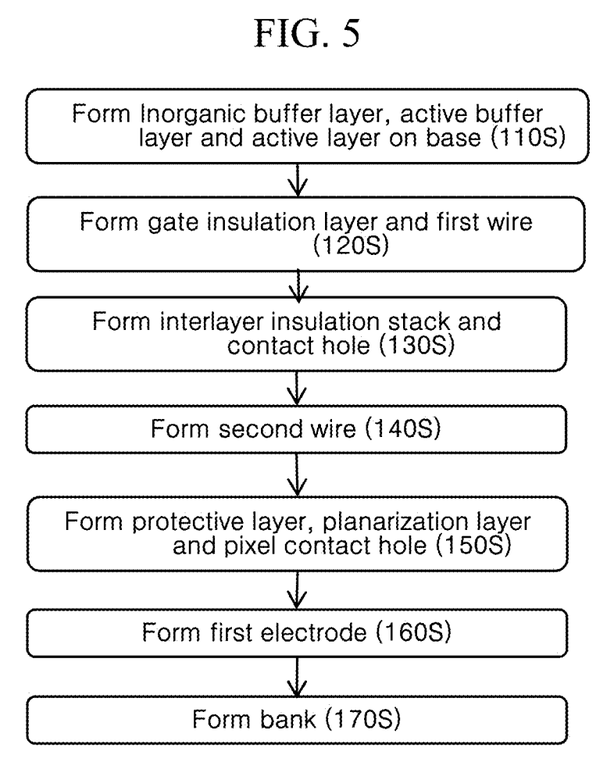
FIG. 5 is a process flowchart illustrating a method of manufacturing the backplane substrate according to the present disclosure.
Figure 6:
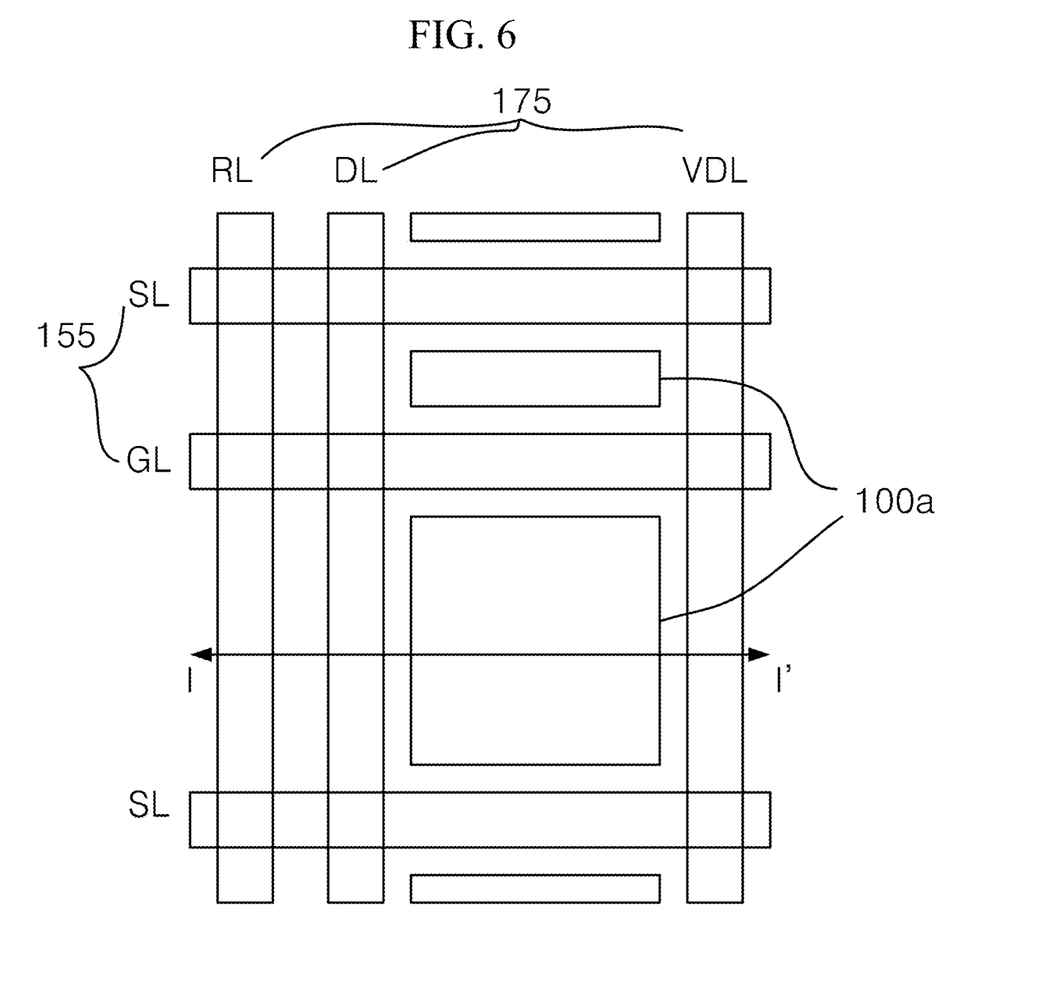
FIG. 6 is a plan view illustrating a dummy pixel of the backplane substrate according to the present disclosure.
Figure 7:
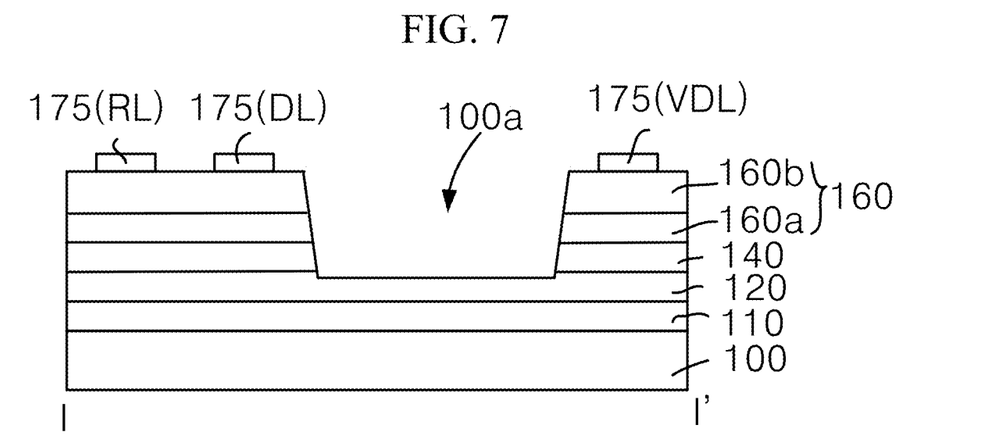
FIG. 7 is a cross-sectional view taken along line I-I' of FIG. 6.
Figure 8:
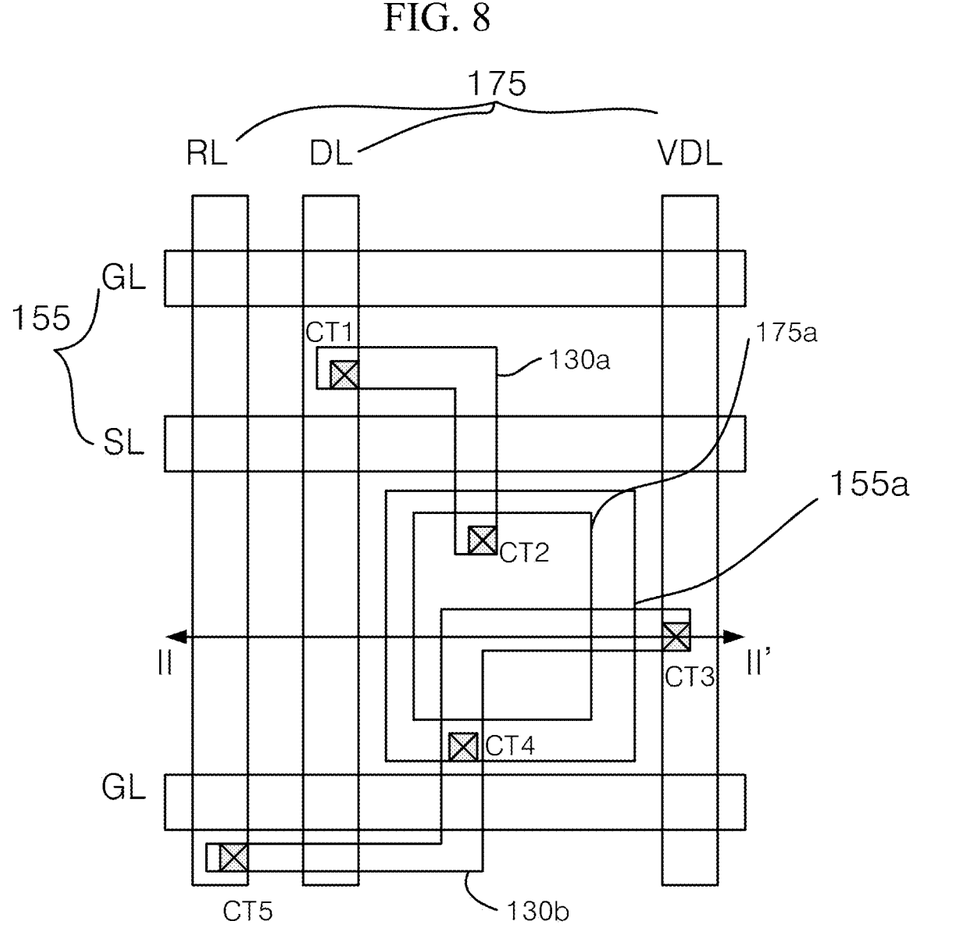
FIG. 8 is a plan view illustrating a pixel of the backplane substrate according to the present disclosure.
Figure 9:
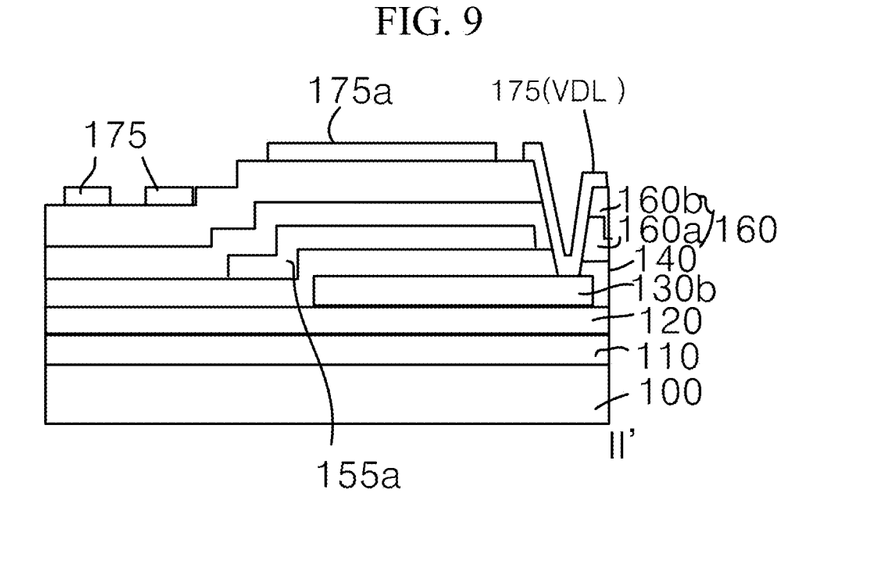
FIG. 9 is a cross-sectional view taken along line II-II' of FIG. 8.

FIG. 5 is a process flowchart illustrating a method of manufacturing the backplane substrate according to the present disclosure. In addition, FIG. 6 is a plan view illustrating the dummy pixel of the backplane substrate according to the present disclosure, and FIG. 7 is a cross-sectional view taken along line I-I' of FIG. 6. In addition, FIG. 8 is a plan view illustrating the pixel of the backplane substrate according to the present disclosure, and FIG. 9 is a cross-sectional view taken along line II-II' of FIG. 8.

As illustrated in FIGS. 5 to 11, the method of manufacturing the backplane substrate of the present disclosure is performed in the following sequence.

First, after a sacrificial layer (not illustrated) is formed on a glass substrate (not illustrated), the flexible base 100 is formed on the sacrificial layer.

The flexible base 100, which constitutes the backplane substrate 1000, is a flexible plastic film, which may include one or more polymer compounds selected from among the group consisting of polyester or a copolymer including polyester, polyimide or a copolymer including polyimide, an olefin-based copolymer, polyacrylic acid or a copolymer including polyacrylic acid, polystyrene or a copolymer including polystyrene, polysulfate or a copolymer including polysulfate, polycarbonate or a copolymer including polycarbonate, polyamic acid or a copolymer including polyamic acid, polyamine or a copolymer including polyamine, polyvinylalcohol, and polyallylamine. Here, the thickness of the flexible base 100 ranges from 5 μm to 150 μm. The thickness of the flexible base 100 may be 50 μm or less.

In the following description, the respective components are assumed as being formed on the entire flexible base 100 and the formation area thereof is not limited to the active area AA, but may also include the dead area DA2 including the dummy pixels DP unless specifically stated otherwise.

Subsequently, an inorganic buffer layer 110, which is in the form of a plurality of layers, and an active buffer layer 120 are sequentially formed on the base 100. The inorganic buffer layer 110, which is in the form of a plurality of layers, is provided to protect a thin-film transistor array and an organic light-emitting array in the subsequent process of removing the glass substrate (not illustrated) under the base 100.

Subsequently, after an amorphous silicon layer is deposited on the active buffer layer 120 and is then crystallized into polysilicon using a laser, the polysilicon is selectively removed to form an active layer 130 (110S). The active buffer layer 120 may prevent foreign substances of, for example, the glass substrate (not illustrated) from having an effect on the active layer 130 upon deposition or laser crystallization in the process of forming the active layer 130, and may protect the active layer 130.

Here, the active layer 130 may be provided to correspond only to the sub-pixels SP, and in some cases, may be provided in the dummy pixels DP as well as the sub-pixels SP. In addition, as illustrated in FIGS. 8 and 9, the active layer 130 may be formed into branches 130a and 130b for the respective thin-film transistors of each sub-pixel, or may be formed in the respective sub-pixels in a one-to-one ratio.

Subsequently, a gate insulation layer 140 is formed on the active buffer layer 120 and the active layer 130.

Subsequently, a first metal is deposited on the gate insulation layer 140 and is selectively removed to form a plurality of first wires 155 in a line direction (120S). The first wires 155 refer to all wires formed in the same line direction, and may be provided to correspond to the sub-pixels SP. In addition, the first wires 155 may be formed across the sub-pixels to extend to the dummy pixels so as to be electrically connected to the scan drivers SD1 and SD2. For example, the first wires 155 may include the gate line GL of FIG. 3. In some cases, when a circuit configuration provided in the sub-pixel has an additional component compared to the basic configuration of FIG. 3, the first wires 155 may further include, for example, a scan line SL, in addition to the gate line GL. A first storage electrode 155a of the storage capacitor may be formed in the same layer as the first wires 155 using the same metal.

Subsequently, an interlayer insulation stack 160, which includes a plurality of interlayer insulation layers 160a and 160b, is formed on the gate insulation layer 140 on which the first wires 155 have been formed.

Subsequently, the interlayer insulation stack 160 and the gate insulation layer 140 are selectively removed to form contact holes CT1 to CT5, which expose a portion of the active layer 130 (130S).

Subsequently, a second metal is deposited on the interlayer insulation stack 160 having the contact holes CT1 to CT5 therein and is then selectively removed to form second wires 175 in a direction crossing the first wires 155 (140S). Here, a portion of the second wires is connected to some of the contact holes. The second wires 175 may include the data line DL and the driving current line VDL of the circuit of FIG. 3. Alternatively, when an additional thin-film transistor or an additional capacitor is provided, compared to the circuit of FIG. 3, the second wires 175 may further include an additional wire such as, for example, a reference voltage line RL, in addition to the data line DL and the driving current line VDL. In addition, a second storage electrode 175a, which constitutes the storage capacitor, may be formed in the same layer as the second wires 175 in the same process.

Here, the configuration from the active layer 130 to the second wires 175 is referred to as a thin-film transistor array.

Subsequently, a protective layer 180 and a planarization layer 190 are formed on the second wires 175.

Subsequently, the protective layer 180 and the planarization layer 190 are selectively removed to expose a portion of the second wires 175 and define pixel contact holes (150S).

Subsequently, for example, a third metal or metal oxide layer is deposited on the planarization layer 190 having the pixel contact holes therein and is selectively removed to form the first electrode 200, which is connected to the second wires 175 through the pixel contact holes (160S). The planarization layer 190 might be made of an organic material that has greater flexibility than a glass material or a metal, as explained later herein. An organic insulation layer, such as a photoresist or other known organic insulator useful in OLED arrays can be used for layer 190. In one embodiment, the material for layer 190 is selected to be more flexible than glass and less subject to fatigue stress fractures than metal, as explained later herein. At the slit 100a, the material that is susceptible to propagating cracks is removed and replaced with a material that will not create or propagate cracks, but rather will block the propagation of cracks.

Subsequently, a bank 210 is formed in an area of each sub-pixel excluding an emission portion (170S).

Subsequently, an organic light-emitting layer 220 (see FIG. 11) is deposited on the bank 210 and on the first electrode 200 including the emission portion.

Subsequently, a second electrode 230 is formed on the organic light-emitting layer 220 using a fourth metal or metal oxide layer. The first electrode 200, the organic light-emitting layer 220 and the second electrode 230 are referred to as the organic light-emitting diode OLED.

In addition, the configuration from the first electrode 200 to the second electrode 230 is referred to as an organic light-emitting array.

An encapsulation layer 240 is provided on the organic light-emitting array in order to cover at least the sub-pixels SP and to prevent moisture permeation. Although a portion of the encapsulation layer 240 may be provided in the dummy pixels, the encapsulation layer 240 may be selectively provided in the dummy pixel portion because the dummy pixels have no layer that is vulnerable to moisture permeation, like the organic light-emitting layer.

Here, the configuration from the flexible base 100 to the encapsulation layer 240 described above is referred to as the backplane substrate.

The slits 100a of the dummy pixel portion illustrated in FIGS. 5 and 6 may be defined simultaneously with the formation of contact holes in the interlayer insulation stack. Alternatively, the slits 100a may be defined in the etching process of the protective layer 180 and the planarization layer 190 when the pixel contact holes are formed after the formation of the second wires 175.

Here, the slits 100a may be formed in inorganic layers, which are likely to break up, among insulation layers formed on the flexible base 100. Accordingly, the slits 100a may be formed by removing the interlayer insulation stack 160 between the first wires 155 and the second wires 175. Here, the interlayer insulation stack 160 may include a plurality of inorganic layers, and the inorganic layers may include, for example, an oxide layer, a nitride layer, and an oxide nitride layer.

The insulation layers such as the gate insulation layer 140 and the interlayer insulation stack 160 are usually made of a type of glass, for example, silicon dioxide or silicon nitride. Such insulation layers have a first level of rigidity that is very rigid and also fragile since they are a type of glass. They are subject to propagating cracks if bent, particularly once they start to crack. The metal layers 155 and 175 will generally be made of a rigid metal, such as aluminum. A layer of metal has a second level of rigidity, which, though not as rigid as glass, is still quite rigid and it is subject to propagating cracks if it is repeated flexed, rolled or bent. The metal, such as aluminum, even though it is not as rigid as glass, is still very rigid. Further, and perhaps more important, it is subject to metal fatigue when repeatedly flexed. Thus, while it might not crack on the first few times of being bent, repeated bending of the metal creates metal fatigue which propagates cracks. As can be seen, in FIGS. 7 and 11, those rigid layers and fatigue susceptible layers are removed in the location of the slit 100*a* and replaced with layer 190 which has third flexibility that is quite high. Namely, layer 190 will be made of a more flexible material that will not propagate cracks if repeated flexed.

In addition, the slits 100*a* may be defined by further removing the gate insulation layer 140, which is provided under the interlayer insulation stack 160, or may be defined by further removing the active buffer layer 120, which is provided under the gate insulation layer 140.

Alternatively, when the slits 100*a* are defined after the second wires 175 are formed, the etching processes of the protective layer 180 and the planarization layer 190 are separately performed. In the process of etching the protective layer 180, the slits 100*a* may be defined by removing all of the protective layer 180, the interlayer insulation stack 160, and the gate insulation layer 140. That is, the slits 100*a* may be defined by further removing the protective layer 180 above the interlayer insulation stack 160.

The slits 100*a* are defined by removing at least two or more inorganic insulation layers. The plurality of slits 100*a* is defined in the dummy pixel portion so that the propagation of stress in the folding direction is prevented by the slits 100*a*. Accordingly, the number of slits provided in the folding direction may be increased in order to reduce the folding stress.

In some cases, the slits 100*a* may be formed by removing a portion of the active buffer layer 120 under the gate insulation layer 140 in the thickness direction.

Hereinafter, with regard to the configuration of the thin-film transistor array, the configuration of the dummy pixel will be described with reference to FIGS. 5 and 6 and the configuration of the sub-pixel will be described with reference to FIGS. 7 and 8.

As illustrated in FIGS. 5 and 6, in the backplane substrate of the present disclosure, the dummy pixel includes the first wires 155 extending from the sub-pixel. The plurality of first wires 155 may include the gate line GL and the scan line SL in each dummy pixel.

In addition, the plurality of second wires 175 may include the data line DL, the reference voltage line RL, and the current driving line VDL in each dummy pixel.

As illustrated in FIGS. 6 and 7, the slits 100*a* may be defined in a portion of the dummy pixel in which the first and second wires 155 and 175 are not located when viewing in a plan view.

However, the disclosure is not limited thereto, and in some cases, the slits 100*a* may be located over the first wires 155. The slits 100*a* may be defined and created simultaneously with the formation of contact holes in the interlayer insulation stack of the sub-pixel using the same masks and etching. Since the etch selectivity of metal differs from the etch selectivity of an insulation layer, when the slits 100*a* are defined via the removal of the interlayer insulation stack 160, the first wires 155 may remain under the slits 100*a*. It is also possible to change the etch chemistry during the formation of the slits 100*a* to remove both metal and the various insulation layers.

Meanwhile, in the backplane substrate of the present disclosure, the dummy pixel includes the first and second wires 155 and 175, which have the same shape as that in the sub-pixel. Here, the first wires 155 extend from the active area AA to the dummy pixel portion DA1 and are electrically connected to the scan drivers SD1 and SD2. As such, the first wires 155 may apply common signals to the active area AA and the dummy pixel portion DA1. In addition, even if the second wires 175 are electrically disconnected between the sub pixel SP and the dummy pixel DP, the second wires 175 may be formed in the dummy pixel DP and may be connected to a shorting bar on the outer peripheral portion, thereby performing an anti-electrostatic function. Here, the second wires 175 provided in the dummy pixel DP are referred to as dummy wires because they are not electrically connected to the sub-pixel SP.

As illustrated in FIGS. 8 and 9, in the sub-pixel SP, a sensing transistor is defined by a sensing line SL, a first active layer 130*a*, which passes through the sensing line SL and is branched in opposite directions, a data line DL, which is connected to the first active layer 130*a* through the first and second contact holes CT1 and CT2, and the second storage electrode 175*a*. In addition, a switching transistor is defined by the gate line GL, a second active layer 130*b*, which passes through the gate line GL and is branched in opposite directions, the reference voltage line RL, which is connected to the second active layer 130*b* through the fifth and fourth contact holes CT5 and CT5, and the first storage electrode 155*a*.

In addition, a driving transistor is defined, which shares the fourth contact hole CT4 in one side of the second active layer 130*b* with the switching transistor. The driving transistor is connected to the driving current line VDL through the third contact hole CT3 in the other side of the second active layer 130*b*, and is used as a driving gate electrode of the second storage electrode 175*a*.

Although the sub-pixel includes a 3T1C structure in the above-described example, the circuit configuration of the sub-pixel is not limited thereto, and the sub-pixel may have any other configuration. In the backplane substrate of the present disclosure, the slits in the dummy pixel may be formed simultaneously with the formation of the contact holes CT1 to CT5, and the layered structure from which the slits are removed may be changed depending on the configuration of the sub-pixel. In any case, the slits may be defined to distinguish the dummy pixels from each other, and one or more slits may be provided for each dummy pixel.

Hereinafter, a flexible display having the above-described backplane substrate will be described.

Figure 10:
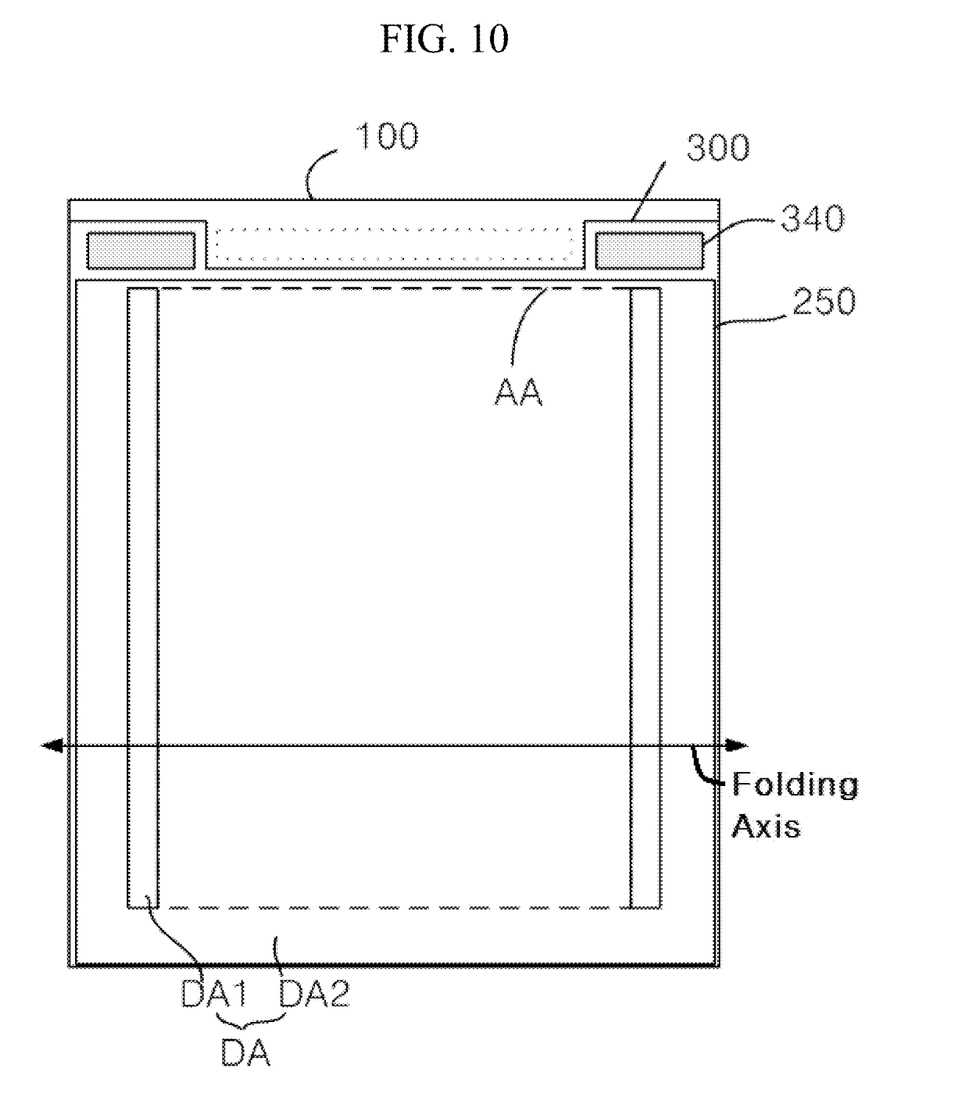
FIG. 10 is a plan view illustrating a flexible display according to the present disclosure.
Figure 11:
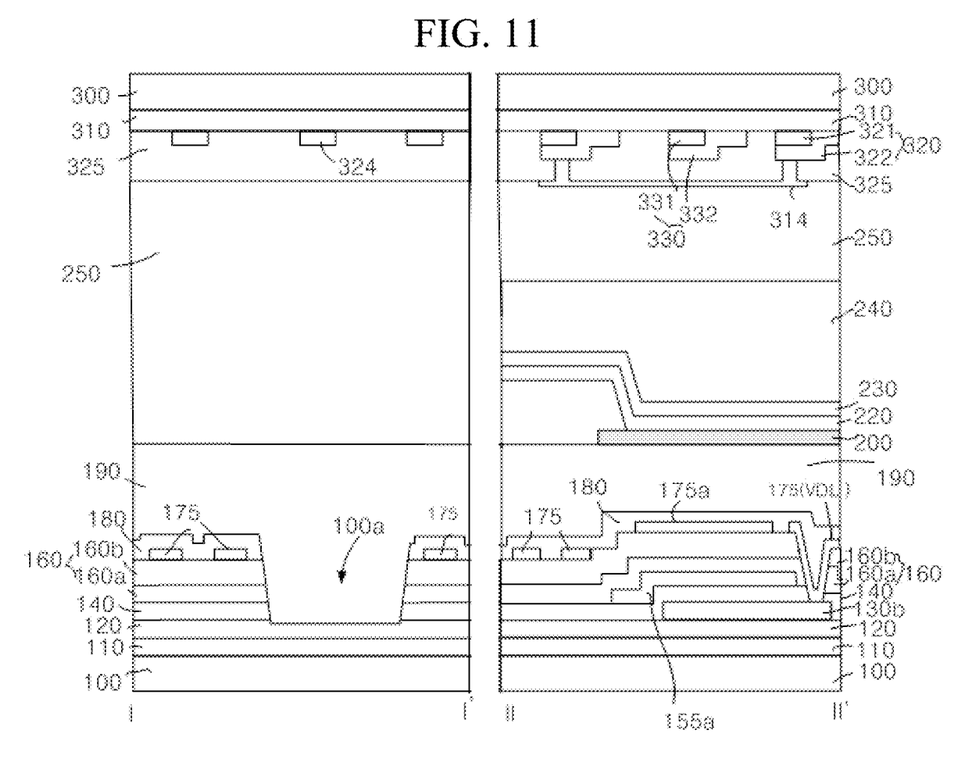
FIG. 11 is a cross-sectional view illustrating a sub-pixel and a dummy pixel of the flexible display according to the present disclosure.

FIG. 10 is a plan view illustrating a flexible display according to the present disclosure, and FIG. 11 is a cross-sectional view illustrating a sub-pixel and a dummy pixel of the flexible display according to the present disclosure.

As illustrated in FIG. 10, the flexible display of the present disclosure is configured in such a manner that the base 100 of the backplane substrate, which includes a thin-film transistor array and an organic light-emitting array, and an opposing base 300, which is opposite the base 100 and includes a touch electrode array, are bonded to each other via an adhesive layer 250.

Here, electrical signals of the touch electrode array are transmitted to each transmission part Tx and each transport part Rx, which are provided in the touch electrode array, via the provision of a touch pad portion 340 in a portion of the dead area DA around the active area AA of the opposing base 300.

In addition, a touch pad of the touch pad portion 340 is connected to a dummy pad of a dummy pad portion provided on the base 100, which is opposite the touch pad portion 340, via an anisotropic conductive film.

Meanwhile, the adhesive layer 250 is provided between the base 100 and the opposing base 300, which are opposite each other, excluding the touch pad portion 340.

In one embodiment, as can be seen in FIG. 11, in the area overlying the slits 100a, the encapsulation layer 240 is not present, instead it is replaced by the adhesive layer 250 for the entire height difference between layer 190 and layer 325. The adhesive layer 250, like layer 190, will be made of a highly flexible material that does not crack when repeated bent. They are many adhesive layers known in the art that are flexible, among them are various organic polymer adhesives that can be used for layer 250. The encapsulation layer 240 can be made of various materials, but in one embodiment is a silicon oxide or a silicon nitride, which are somewhat rigid glass materials. The adhesive layer 250 is more flexible than the layer 240. Other configurations not described with reference to FIGS. 5 to 9 will be described below.

The flexible display may include the protective layer 180 and the planarization layer 190, which cover the second wires 175 and second dummy wires (designated by 175), the organic light-emitting diode OLED, which is provided on the planarization layer 190 so as to correspond to each sub-pixel and includes the first electrode 200, the organic light-emitting layer 220 and the second electrode 230, the encapsulation layer 240, which covers the organic light-emitting diode OLED, the opposing base 300, which is opposite the base 100, the touch electrode array provided on the opposing base 300, and the adhesive layer 250 between the touch electrode array and the encapsulation layer 240.

The encapsulation layer 240 may have an area greater than that of the planarization layer 190 and may cover the second wires 175 (and second dummy wires) and the slits 100a of the dummy pixel portion in one embodiment.

Meanwhile, the touch electrode array may include a plurality of first and second touch electrodes 320 and 330, which correspond to the active area AA and cross each other on the opposing base 300.

The opposing base 300, on which the touch electrode array is formed, may be a flexible base in the same manner as the base 100, and may be formed using the same material as the above-described base 100.

In addition, an inorganic buffer layer 310 of the touch electrode array, which is in the form of a plurality of layers, may be provided on the opposing base 300 for the same reason as the reason why the inorganic buffer layer 110 is provided on the base 100. That is, after a sacrificial layer and the opposing base 300 are formed on a glass substrate (not illustrated), the inorganic buffer layer 310 is provided in order to protect the touch electrode array when the glass substrate 300 is removed after the touch electrode array is formed.

In addition, although the first and second touch electrodes 320 and 330 are respectively the stacks of metal meshes 321 and 331 and transparent conductive layers 322 and 332 in the illustrated example, the disclosure is not limited thereto, and the first and second touch electrodes 320 and 330 may have a single layer configuration. The metal mesh may be, for example, an Ag—Pd—Cu (APC) alloy or a Mo—Al—Mo alloy. However, the metal meshes 321 and 331, which constitute the first and second touch electrodes 320 and 330, are not limited to above enumerated examples, and may be replaced with any other low-resistance metal, or a metal alloy or a metal stack thereof.

In addition, the transparent conductive layers 322 and 332 may be formed of a transparent metal oxide layer such as, for example, ITO, IZO, ITZO or IGZO.

Meanwhile, neighboring first touch electrodes 320 are connected to each other via a bridge electrode 314, which is provided in another layer, at the intersection with the second touch electrodes 330. The bridge electrode 314 is connected to the first touch electrodes 320 via a contact hole, which is formed by removing predetermined regions of the first touch electrodes 320, with a touch interlayer insulation layer 325 on the first and second touch electrodes 320 and 330.

Meanwhile, routing wires 324 may be provided in the same layer as the metal meshes so as to correspond to the dummy pixel DP or the dead area.

Meanwhile, as illustrated in the example of FIG. 11, the dummy pixel DP includes the slit 100a, which is defined by removing the protective layer 180, the interlayer insulation stack 160, the gate insulation layer 140, and a portion of the active buffer layer 120 in the thickness direction.

The slit 110a may be modified in shape as described in the description of the backplane substrate, and in any case, is formed by removing a plurality of inorganic insulation layers.

As is apparent from the above description, a backplane substrate and a flexible display using the same according to the present disclosure has the following effects.

First, a plurality of slits is formed in inorganic insulation layers, which are likely to break up or crack, in a dummy pixel portion. Thereby, the propagation of cracks from the outer peripheral portion may be prevented by the slits.

Second, when the propagation of cracks is prevented, the introduction of water from the outside due to cracks may also be prevented, which may prevent water permeation to sub-pixels in an active area.

Third, the slits may prevent stress from being applied in a folding direction even if a flexible display device undergoes repeated folding.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Accordingly, various embodiments disclosed in the present disclosure are not intended to limit the technical sprit of the present disclosure, and the scope of the technical sprit of the present disclosure is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A backplane substrate, comprising:
    a base in which an active area having a plurality of sub-pixels is defined in a center region thereof and a dummy pixel portion having dummy pixels is defined along an edge of the active area;
    a buffer stack on the base overlying both the active area and the dummy pixel portion;
    a plurality of first wires on the buffer stack in a first direction at both of the active area and the dummy pixel portion, the first wires being in contact with the buffer stack;
    an interlayer insulation stack overlying the first wires, the interlayer insulation stack including a plurality of interlayer inorganic layers at both of the active area and the dummy pixel portion;
    a plurality of second wires at the active area and a plurality of second dummy wires at the dummy pixel portion, the second wires and the second dummy wires on the interlayer insulation stack in a second direction crossing the first direction; and
    a plurality of slits at the dummy pixel portion to separate the interlayer insulation stack for the respective dummy pixels defined by crossing the first wires and the second dummy wires,
    wherein an organic layer is filled within each of the plurality of slits at the dummy pixel portion.

2. The backplane substrate according to claim 1, wherein the slits include one or more slits in each dummy pixel.

3. The backplane substrate according to claim 1, wherein the slits are defined by removing at least one inorganic layer of the interlayer insulation stack and the organic layer is present in a region in which the at least one inorganic layer is removed.

4. The backplane substrate according to claim 3, wherein the interlayer inorganic layers include glass material and the organic layer in the slit is made of an organic polymer.

5. The backplane substrate according to claim 4, wherein the glass material has a first rigidity and the organic polymer has a second rigidity that is significantly less than the rigidity of the glass material and is thus less susceptible to cracking when being bent.

6. The backplane substrate according to claim 1, wherein the buffer stack includes one or more inorganic buffer layers, an active buffer layer and a gate insulation layer.

7. The backplane substrate according to claim 6, wherein the slits are defined by removing the interlayer inorganic layers and the gate insulation layer under the interlayer inorganic layers.

8. The backplane substrate according to claim 6, wherein the slits are defined by removing the interlayer inorganic layers, and the gate insulation layer and the active buffer layer under the interlayer inorganic layers.

9. The backplane substrate according to claim 6, further comprising an active layer between the active buffer layer and the gate insulation layer in the sub-pixels.

10. The backplane substrate according to claim 1, wherein the slits expose at least one of the buffer stack or the first wires.

11. The backplane substrate according to claim 1, wherein an edge of each of the plurality of slits is along the first wires or the second dummy wires within each dummy pixel.

12. The backplane substrate according to claim 1, further comprising a scan driver outside the dummy pixel portion.

13. The backplane substrate according to claim 12, wherein the first wires are connected to the scan driver.

14. The backplane substrate according to claim 1, wherein the organic layer has a greater resistance to cracking than the interlayer insulating stack.

15. A flexible display, comprising:
    a backplane substrate including a lower base in which an active area having a plurality of sub-pixels is defined in a center region thereof and a dummy pixel portion having dummy pixels is defined along an edge of the active area, a buffer stack on the lower base including the active area and the dummy pixel portion, a plurality of first wires in a first direction at both the active area and the dummy pixel portion to be in contact with the buffer stack, an interlayer insulation stack including a plurality of layers made of inorganic material and overlying the first wires at both of the active area and the dummy pixel portion, a plurality of second wires at the active area and a plurality of second dummy wires at the dummy pixel portion, the second wires and the second dummy wires on the interlayer insulation stack in a second direction crossing the first direction, and a plurality of slits at the dummy pixel portion to separate the interlayer insulation stack for the respective dummy pixels, defined by crossing the first wires and the second dummy wires, wherein an organic layer is filled within each of the plurality of slits at the dummy pixel portion;
    a planarization layer to cover the second wires and the second dummy wires on the backplane substrate, the planarization layer being more flexible when bent than the inorganic material of the interlayer insulation stack;
    organic light-emitting diodes on the planarization layer corresponding to the respective sub-pixels, each organic light-emitting diode including a first electrode, an organic light-emitting layer and a second electrode;
    an encapsulation layer overlying the organic light-emitting diodes;
    an upper base layer opposing the lower base;
    a touch electrode array on the upper base; and
    an adhesive layer between the touch electrode array and the encapsulation layer, the adhesive layer being comprised of a material that is more flexible when bent than the inorganic material of the interlayer insulation stack.

16. The flexible display according to claim 15, wherein the encapsulation layer has an area greater than that of the planarization layer, and covers the second dummy wire and the slits.

17. The flexible display according to claim 16, wherein the touch electrode array includes a plurality of first and second touch electrodes on the upper base corresponding to the active area, the first and second touch electrodes crossing each other.

18. The flexible display according to claim 15, wherein the adhesive layer is comprised of an organic polymer.

19. The flexible display according to claim 15, wherein the planarization layer is comprised of a photoresist.

20. The flexible display according to claim 15, wherein an organic layer is filled within each of the plurality of slits at the dummy pixel portion.

21. The flexible display according to claim 15, wherein the dummy pixels are defined by crossing the first wires and the second dummy wires.

* * * * *